(12) United States Patent
Kim et al.

(10) Patent No.: US 6,836,018 B2
(45) Date of Patent: *Dec. 28, 2004

(54) WAFER LEVEL PACKAGE AND METHOD FOR MANUFACTURING THE SAME

(75) Inventors: Gu-Sung Kim, Kyungki-do (KR);
Dong-Hyeon Jang, Kyungki-do (KR);
Min-Young Son, Kyungki-do (KR);
Sa-Yoon Kang, Kyungki-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

This patent is subject to a terminal disclaimer.

(21) Appl. No.: 10/304,264

(22) Filed: Nov. 25, 2002

(65) Prior Publication Data

US 2003/0102560 A1 Jun. 5, 2003

Related U.S. Application Data

(63) Continuation of application No. 09/752,856, filed on Dec. 29, 2000, now Pat. No. 6,518,675.

(51) Int. Cl.$^7$ .............................................. H01L 23/48
(52) U.S. Cl. ..................... 257/773; 257/772; 257/774; 257/779; 257/780; 257/781; 257/737; 257/786
(58) Field of Search ................................ 257/772–774, 257/779–781, 737, 786

(56) References Cited

U.S. PATENT DOCUMENTS

| | | | |
|---|---|---|---|
| 4,813,129 A | * | 3/1989 | Karnezos ..................... 29/832 |
| 5,679,977 A | | 10/1997 | Khandros et al. |
| 5,780,933 A | | 7/1998 | Ohmori et al. |
| 5,852,326 A | | 12/1998 | Khandros et al. |
| 6,022,763 A | | 2/2000 | Ohmori et al. |
| 6,277,669 B1 | * | 8/2001 | Kung et al. .................. 438/106 |
| 6,333,565 B1 | | 12/2001 | Hashimoto |
| 6,462,414 B1 | * | 10/2002 | Anderson ..................... 257/738 |
| 6,518,675 B2 | * | 2/2003 | Kim et al. .................... 257/773 |
| 2001/0004943 A1 | | 6/2001 | Blackshear et al. |

FOREIGN PATENT DOCUMENTS

JP     2000-031191     1/2000

OTHER PUBLICATIONS

English Language of Abstract form Japanese Patent Publication No. 2000–031191.
Semyon Vaynman, et al. "Energy–Based Methodology for the Fatigue Life Prediction of Solder Materials" *IEEE Transactions On Components, Hybrids, and Manufacturing Technology*, vol. 16, No. 3, pp. 317–322, 1993.

\* cited by examiner

*Primary Examiner*—Luan Thai
(74) *Attorney, Agent, or Firm*—Marger Johnson & McCollom, P.C.

(57) ABSTRACT

A thermal-stress-absorbing interface structure is provided between a semiconductor integrated circuit chip and a surface-mount structure. The interface structure comprises an elongated conductive-bump pad having a first lengthwise end and a second length-wise end, and a side. The pad has an interconnection line extending from the side thereof intermediate the first and the second ends. The interconnection line is electrically connected to the chip. The interface structure further includes a first polymer layer having an exposed surface, and a second polymer layer, each having a different modulus of elasticity, disposed below the pad. The second polymer layer extends over substantially the entire exposed surface of the first polymer layer to absorb a thermal stress during thermal cycling.

17 Claims, 5 Drawing Sheets

WAFER LEVEL PACKAGE AND METHOD FOR MANUFACTURING THE SAME

This application is a continuation application of U.S. patent application Ser. No. 09/752,856 filed Dec. 29, 2000, now U.S. Pat. No. 6,518,675 which is herein incorporated by reference in its entirety.

BACKGROUND OF THE INVENTION

1. Field of the Invention

The present invention generally relates to the field of semiconductor manufacturing and, more particularly, to a wafer level package (WLP) with improved interconnection reliability and a method for manufacturing the same.

2. Description of the Related Art

In order to meet ever-demanding packaging requirements for newer generations of electronic products, countless efforts have been expended to create the most reliable, cost-effective, small, and high-performance packages. Such requirements are, for example, reductions in propagation delay and in overall component area as well as broader latitude in input/output (I/O).

To meet those requirements, a wafer level package (WLP) has been recently developed. In the WLP, unlike the periphery leaded packages, an array of external terminals is distributed over the semiconductor surface in place of outer leads of leaded packages. This reduces the signal path from a semiconductor chip to package I/O location, thereby improving the electrical performance of the device. Further, the area it occupies when mounted onto a printed circuit board or other substrate is the size of the chip. Thus, the size of the WLP is very small.

For these reasons, almost all WLPs use metallic solder balls disposed in an area array fashion to interconnect the package to the printed circuit board.

However, due to grossly mismatched coefficient of thermal expansions (CTE) between the chip and the printed circuit board, if the metallic solder balls, which are minimally elastic, alone were used to interconnect the chip contacts to the substrate, the strain would be absorbed by the solder balls, causing them to crack and fail due to the mechanical stress of the differential CTE of the chip relative to the printed circuit board, thereby damaging the reliability of the solder connection.

In other words, when the chip heats up during use, both the chip and the board expand, and when the heat is removed, both the chip and the substrate shrink. The problem that arises is that the chip and the substrate expand and contract at different rates and at different times, thereby stressing the interconnections or solder balls between them.

Some attempts have been made to solve these problems, but they turned out to be unsuccessful. Moreover, if the chip size becomes large, it has been discovered that the residual stress or displacement at the periphery of the chip also significantly increases compared to that of the center portion of the chip.

As a result, with conventional structures, experience says that it is not sufficient to prevent the solder cracking or the breakage of metal interconnection at the side of the solder ball pad, especially near the edge of the chip.

Therefore, what is needed is a newly designed WLP with improved interconnection reliability, especially between the chip and the board, and a method of manufacturing the same.

SUMMARY OF THE INVENTION

The present invention provides a thermal-stress-absorbing interface structure for a WLP and the method of manufacturing the same to improve interconnection reliability of the WLP such as solder joint reliability.

According to preferred embodiments of the present invention, a thermal-stress-absorbing interface structure between a semiconductor integrated circuit chip and a surface-mount structure comprises an elongated conductive-bump pad having a first length-wise end and a second length-wise end, and a side. The thermal-stress-absorbing interface structure further includes means for allowing the first end of the pad to move up when the second end of the pad moves down and alternately allowing the first end to move down when the second end moves up, upon thermal cycling. The means has a center axis. The up-and-down movements of the pad are balanced on the center axis. The interface structure can include a conductive bump formed on the pad.

According one aspect of the present invention, a method of forming a WLP is disclosed. The method comprises providing a semiconductor wafer having a plurality of semiconductor chips and a plurality of scribe lines. Each of the semiconductor chips includes a plurality chip pads and a passivation layer thereon. Then, a multi-layer thermal-stress-absorbing support structure is formed over the resulting structure. Next, a first patterned conductor layer is formed over the multi-layer structure. A first patterned insulation layer is formed over the first patterned conductor layer. Here, the first patterned insulation layer includes an opening therein. The opening exposes a portion of the first patterned conductor layer. Then, a conductive bump is placed over the exposed portion of first patterned conductor layer. Lastly, the wafer is singulated to separate the semiconductor chips to complete the WLP.

Preferably, the multi-layer structure comprises a first polymer layer and a second polymer layer covering the first polymer layer. The first and second polymer layers and the pad including the interconnection line, which extends from the side thereof intermediate the first and the second ends, cooperatively allows the elongated conductive bump pad to make the up-and-down movements pivoted on the center axis and allows the first and second polymers to resiliently deform corresponding to the up-and-down movements of the pad balanced on the center axis, upon thermal cycling. This absorbs or dissipates thermal stresses generated during thermal cycling.

With these features of the present invention, interconnection reliability of the WLP can be significantly improved. For example, the thermal stresses generated during the thermal cycling are absorbed or dissipated efficiently without breakage of the joints (physical connection) between the conductive bump and the underlying structure.

The foregoing and other objects, features and advantages of the invention will become more readily apparent from the following detailed description of a preferred embodiment of the invention that proceeds with reference to the accompanying drawings.

It will be appreciated that for simplicity and clarity of illustration, elements illustrated in the figures have not necessarily been drawn to scale. For example, the dimensions of some of the elements are exaggerated relative to other elements for clarity.

DETAILED DESCRIPTION

The disclosed preferred embodiment enables formation of a wafer level package (WLP) having improved interconnection reliability with a novel thermal-stress-absorbing interface structure between a semiconductor chip and a support structure.

In the following description, numerous specific details are set forth to provide a thorough understanding of the present invention. However, one having ordinary skill in the art should recognize that the invention could be practiced without these specific details. In some instances, well-known process steps, device structures, and techniques have not been shown in detail to avoid obscuring the present invention. Like numerals are used for like and corresponding parts of the various drawings.

Figure 1:
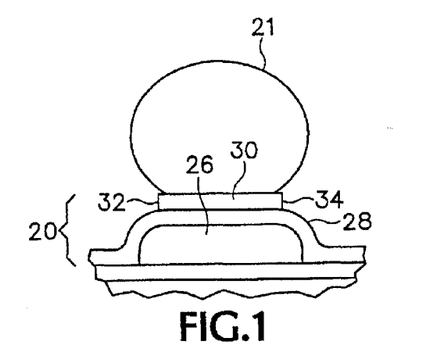
FIG. 1 is a cross-sectional view of a thermal-stress-absorbing interface structure in accordance with one embodiment of the present invention.
Figure 2:
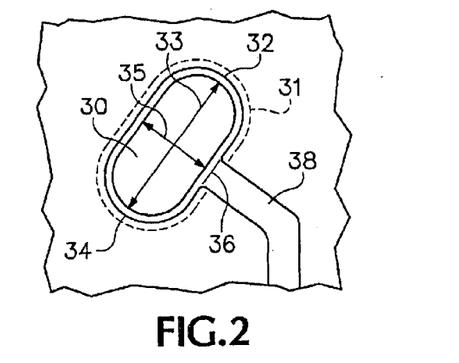
FIG. 2 is a plan view of an elongated conductive bump pad and an interconnection line extending therefrom in accordance with the preferred embodiment of the present invention.
Figure 3:
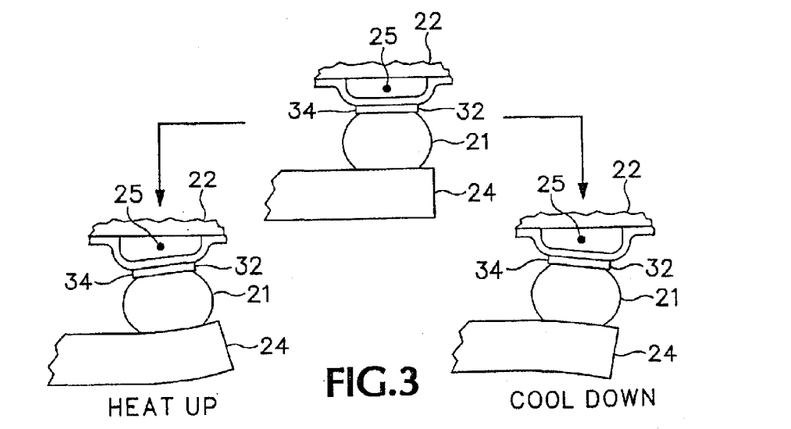
FIG. 3 is a cross-sectional view of the thermal-stress-absorbing interface structure during various stages of thermal cycling, i.e. heating up and cooling down, to show the up-and-down movement of the pad to absorb a thermal stress.

The preferred embodiments of the thermal-stress-absorbing interface structure 20 of the present invention are best understood by referring to FIGS. 1–3 of the drawings. It is to be noted that the invention has been described with the positional relationships between each element shown in FIGS. 1–3 for simplicity. However, one skilled in the art will appreciate that the invention is not necessarily so limited and that the positional relationships can be inverted, e.g., the structure can be up-side-down within the sprit and scope of the invention.

Referring to FIGS. 1 and 3, the preferred embodiment of the invention comprises a thermal-stress-absorbing interface structure 20 that is disposed between a semiconductor integrated circuit chip 22 and a surface-mount structure 24. The surface-mount structure 24 can be a conventional printed circuit board or other similar board-type product on which the semiconductor integrated circuit chip 22 can be mounted.

Preferably, the thermal-stress-absorbing interface structure 20 is a generally planar multi-layer structure as shown in FIG. 1. In detail, the multi-layer structure 20 comprises a first polymer layer 26 having an exposed surface and a second polymer layer 28 covering the exposed first polymer layer 26. The first polymer layer 26 is shaped elongated, preferably, a substantially oval shape in plan view as indicated in dotted line 31 of FIG. 2.

In accordance with one aspect of the present invention, the second polymer layer 28 extends at least over substantially the entire exposed surface of the first polymer layer 26 to efficiently help absorb thermal stresses during thermal cycling.

Preferably, at least two layers of multi-layer structure 20 have different moduli of elasticity. For example, the first polymer layer 26 can be formed of a material having a modulus of elasticity of approximately 5–200 MegaPascal (MPa) and the second polymer layer can be formed of a material having a modulus of elasticity of approximately 1–20 Giga Pascal (GPa). In this respect, the first polymer layer can be an elastomer, or low modulus polymer and the elastomer can be a polysiloxane, or equivalent.

The first polymer layer is preferably formed to a thickness of between approximately 5–35 $\mu$m. Also, according to one embodiment, the second polymer layer comprises a polyimide and is formed to a thickness of approximately 2–50 $\mu$m.

Referring to FIG. 2, the thermal-stress-absorbing interface structure 20 includes an elongated conductive-bump pad 30 having a first length-wise end 32 and a second length-wise end 34, and a side 36. A conductive bump 21 is formed over the elongated bump pad 30 that is preferably of an oval shape or similar shapes. The elongated bump pad 30 further includes an interconnection line 38 extending from the side 36 thereof. The interconnection line 38 is disposed intermediate the first and the second ends 32, 34 along the center axis 25. Here, the ratio of area between the first polymer layer and the pad is approximately 1.1:1.0. Preferably, the ratio is approximately 1:1 for simplicity of fabrication.

The concept of the present invention is illustrated in FIG. 3. The thermal-stress-absorbing interface structure 20 with features described above allows the first end 32 of the elongated bump pad 30 to move up when the second end 34 of the elongated bump pad 30 moves down and alternately allowing the first end 32 to move down when the second end 34 moves up, upon thermal cycling (the heating and cooling cycles of the chip during operation or reliability test). The thermal-stress-absorbing structure 20 has a center axis 25 about which the up-and-down movements occur. In the present invention, the up-and-down movements of the elongated pad 30 are balanced on the center axis 25 to effectively absorb or dissipate the thermal stresses without causing a slip along various physical connections (including the solder-substrate joint or the solder-pad joint) that could lead to breakage of the joints during thermal cycling.

Although the center axis 25 is designated as a certain point in FIG. 3, it is not so limited as such. Any other points that efficiently allow the up-and-down movements of the elongated bump pad 30 for the purpose of the present invention can be designated as such, within the spirit and scope of the present invention.

According to the preferred embodiment of the present invention, it is believed that the interface structure 20 described above including the interconnection line 38 disposed intermediate the first and second ends 32, 34 and the first and second polymer layers 26, 28 cooperatively allows the elongated bump pad 30 to make the up-and-down movements pivoted on the center axis 25 along which the interconnection line extends. Also, with this interface structure scheme, the first and second polymers 26, 28 resiliently deforms accommodating and corresponding to the up-and-down movements of the elongated bump pad 30, balanced on the center axis 25, upon thermal cycling.

As a result, thermal stresses generated during the thermal cycling can be significantly absorbed or dissipated as schematically illustrated in FIG. 3. Interestingly, it is to be noted that when a single layer structure is used in place of the multi-layer structure 20, the up-and-down movements on the center axis 25 that occur with the multi-layer structure 20 do not occur sufficiently, thus resulting in solder joint failures. It is believed that the multi-layer structure 20 of the preferred embodiment help such up-and-down movements to occur, thereby reducing thermo-mechanical stresses applied to the joints. Especially, when the modulus of elasticity of the material for the first polymer layer is 20 times smaller than that of the material for the second polymer layer, the multi-layer structure 20 shows better stress absorption characteristics compared to other cases.

Such effects and advantages of the present invention can be further explained as follows. It is known that the number of shear stress-strain cycles a solder joint can experience before failing is correlated with the damage to the solder-substrate joint. See "Energy-Based Methodology for the Fatigue Life Prediction of Solder Materials," IEEE Transactions On Components, Hybrids, and Manufacturing Technology, Vol. 16, No. 3, pp. 317, 1993. The damage function is defined as the product of the shear stress and the shear strain, i.e., the work performed on the solder in the plastic deformation cycle. With repeated cycling, the damage accumulates and the joint fails. Reducing shear strain reduces solder damage, and extends solder joint life. Reducing the shear stress reduces the shear strain.

In view of this, it is believed that, together with the up-and-down movements of the elongated bump pad 30 and the resilient deformation of the first and second polymers 26, 28 accommodating the up-and-down movements of the pad, balanced on the center axis 25, upon thermal cycling, the conductive bump 21 maintains a normal, i.e. substantially perpendicular, relationship with respect to a plane of the surface-mount structure 24 without the slip or breakage along the various joints including the solder-substrate joint or the solder-pad joint.

Thus, with the preferred embodiments of present invention, the stresses applied to the various joints can be significantly dissipated or reduced. Accordingly, interconnection reliability can be significantly improved in accordance with the present invention.

In this respect, a person skilled in the art will appreciate that other means to allow the up-and-down movements of the elongated bump pad 30 pivoted on the center axis thereof and to allow the conductive bump 21 to maintain a normal, i.e. substantially perpendicular, relationship with respect to a plane of the surface-mount structure 24 without breakage of the joints can be used in place of the generally planar multi-layer structure 20 for the purpose of the present invention.

Further, according to the present invention, the wave action on the pad 30 resulting from the up-and-down movements of the pad 30 produces only torsion-substantially no compression or tension-on the interconnection line 38 due to the position and orientation of the interconnection line 38 relative to the center axis 25. In other words, because the up-and-down movements of the elongated bump pad 30 is based on the center axis 25 pivoted along the direction of the interconnection line 38, the breakage of the interconnection line 38 can be substantially reduced. Because the connection line 38 extends from the center of elongated pad 30, the intermediate portion or center of the elongated bump pad 30 has very low displacement during waving of the elongated bump pad 30 due to thermal cycling.

The present invention semiconductor interface structure can also be characterized as an interface structure comprises an elongated conductive-bump pad 30 having a long axis 33 and a short axis 35, a support structure 26 having, in cross-section, a dome-shape or a dome-shaped edge with a substantially flat top surface. See FIGS. 2 and 8A. Here, the support structure 26 underlying the pad 30 is configured to rock about the short axis 35 during thermal cycling to mitigate the stress of CTE mismatch.

The interface structure can also include a polymer layer 28 covering the dome-shaped support structure 26. Preferably, the dome-shaped support structure 26 comprises an elastomer and the polymer layer 28 comprises a polyimide. See FIG. 8A. Similar to the embodiments described above, the pad 30 is an oval shape in plan view and the pad 30 has an interconnection line 38 extending from the center thereof along the short axis 35.

FIGS. 4–12 illustrates a method for manufacturing a wafer level package (WLP) incorporating a thermal-stress-absorbing interface structure in accordance with preferred embodiment of the present invention. Details of the manufacturing steps are omitted if they are conventional or well known for clarity and simplicity.

Figure 4:
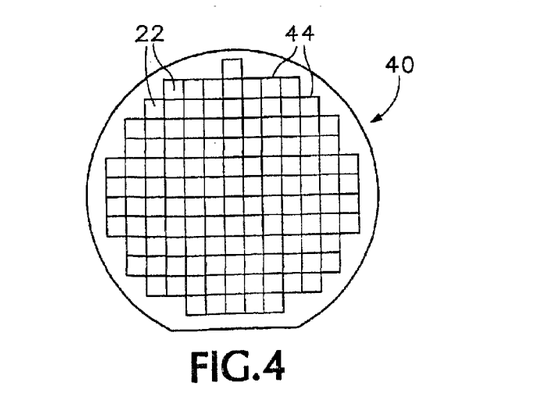
FIG. 4 is a schematic top view of a semiconductor wafer that includes semiconductor integrated circuit chips and scribe lines formed thereon.

As shown in FIG. 4, in order to fabricate a WLP, a semiconductor wafer 40 having a plurality of semiconductor integrated circuit chips 22 and scribe lines 44 between the semiconductor chips 22 is provided.

Figure 5:
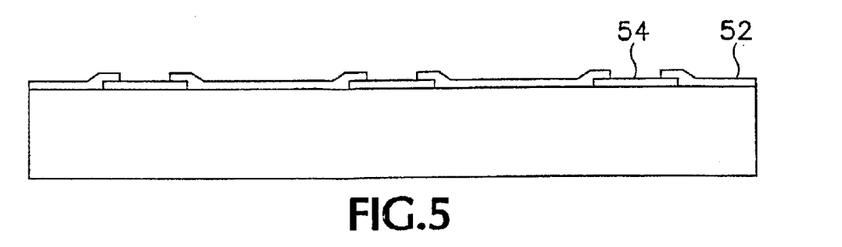
FIG. 5 is a cross-sectional view of a part of the semiconductor substrate with a passivation layer formed thereon exposing chip pads.

Turning to FIG. 5, on the semiconductor wafer 40, a patterned passivation layer 52 exposing a plurality of semiconductor chip pads 54 is formed using conventional techniques. The patterned passivation layer can be formed of a conventional material such as silicon nitride.

Figure 6:
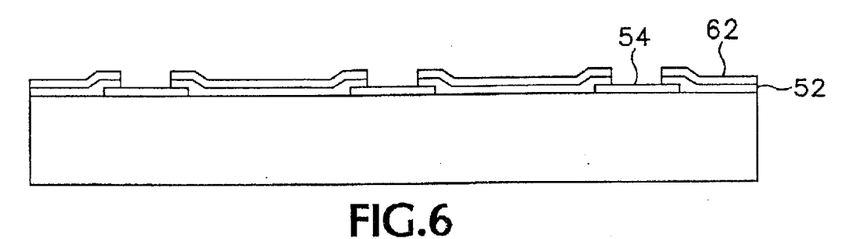
FIG. 6 is a cross-sectional view showing a patterned polymeric layer formed overlying the passivation layer shown in FIG. 5.

After these steps, as shown in FIG. 6, in accordance with one embodiment, a second patterned insulation layer 62 is formed over the passivation layer 52 using conventional techniques such as soft cure, exposure, development and hard cure. The second patterned insulation layer 62 is formed of a polymer such as a polyimide. Preferably, the second patterned insulation layer 62 has a thickness of approximately 2–50 µm.

Figure 7:
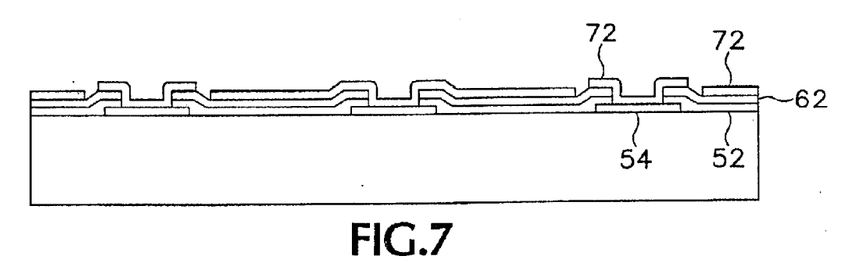
FIG. 7 is a cross-sectional view showing a patterned metal layer for electrical interconnection between the chip pads and conductive bump pads including a ground metal layer.

Now referring to FIG. 7, a second patterned conductor layer 72 is formed over the second patterned insulation layer 47 as a rerouting metallization. The rerouting metallization typically comprises aluminum or copper and is formed to reroute the chip pads 54 in an area array configuration. The thickness of the second patterned conductor layer 72 is preferably approximately 1–20 µm. Preferably, the second patterned conductor layer 72 comprises a mesh-patterned metal layer 71, illustrated in FIG. 8B, such that the adhesion, impedance and capacitance between the second patterned conductor layer 72 and a second polymer layer 28 (to be formed thereon) can be improved. The second patterned conductor layer 72 is preferably formed by a core layer of copper covered with a material such as Cr, Ti, TiN, TaN or WN. Alternatively, the second patterned conductor layer can be formed of a material such as aluminum, nickel, silver, copper, copper alloys, aluminum alloys and nickel alloys.

Figure 8A:
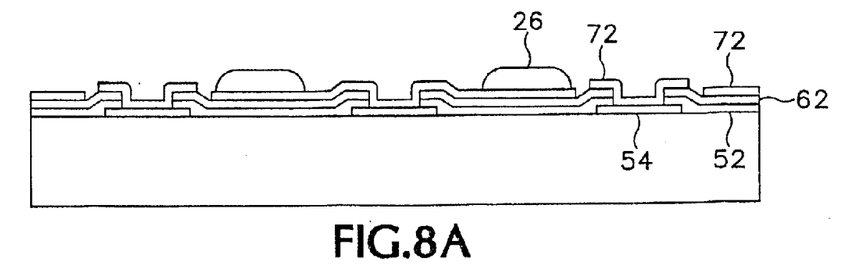
FIG. 8A is a cross-sectional view showing a first polymer layer to form a thermal-stress-absorbing interface structure in accordance with preferred embodiment of the present invention.
Figure 9:
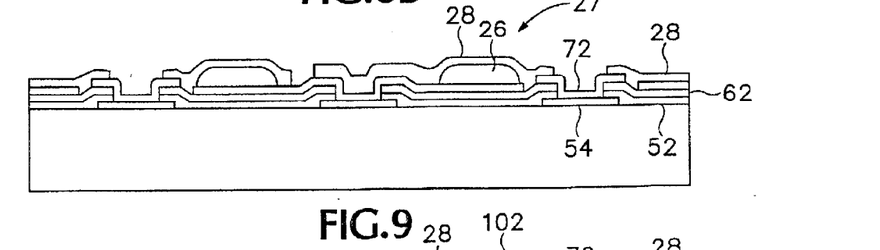
FIG. 9 is a cross-sectional view showing a second polymer layer formed overlying the first polymer layer shown in FIG. 7.

Next, as shown in FIGS. 8A–9, multi-layer structures 27 comprising first and second polymer layers 26, 28 for fabricating thermal-stress-absorbing interface structure 20, shown in FIG. 1, are formed over the resulting structure in accordance with preferred embodiment of the present invention. The multi-layer structures 27 provide more protection to the semiconductor chips 22 from external shock and thermo-mechanical damage applied to joints or interconnection lines of the WLP during reliability test and actual use. Preferably, the multi-layer structures 27 are fabricated by forming the first polymer layer 26 over the second patterned conductor layer 72, and by covering the first polymer layer 26 with a second polymer layer 28. The first polymer layer 26 is formed by conventional techniques such as spin coating and subsequent etching, or by screen-printing.

Figure 8B:
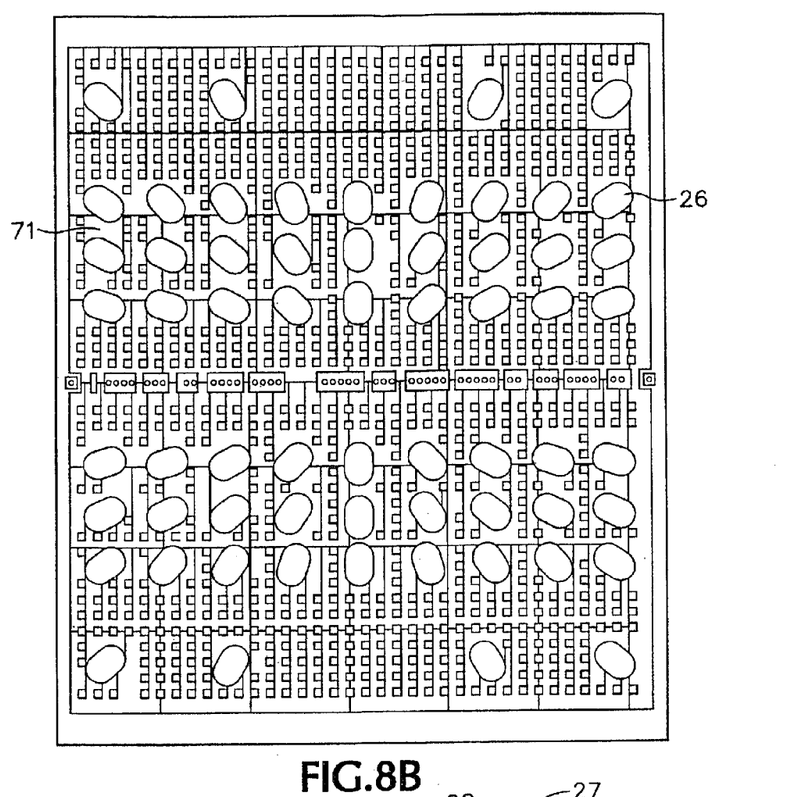
FIG. 8B is a plan view corresponding to FIG. 8A.

After these process steps, as shown in FIG. 8B, the first polymer layer 26 having a substantially oval shape in plan view and a dome or similar shape in cross section can be produced.

Figure 10A:
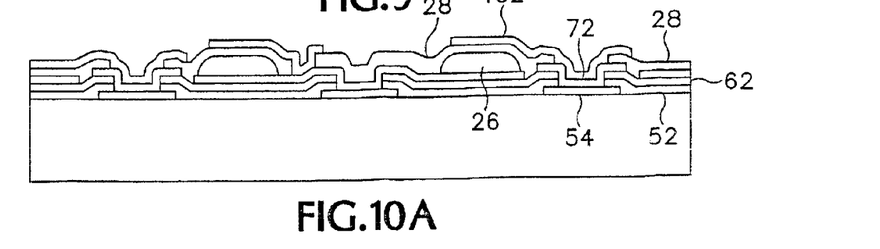
FIG. 10A is a cross-sectional view showing another patterned metal layer for forming a conductive bump pad and an interconnection line extending therefrom as shown in FIG. 2.
Figure 10B:
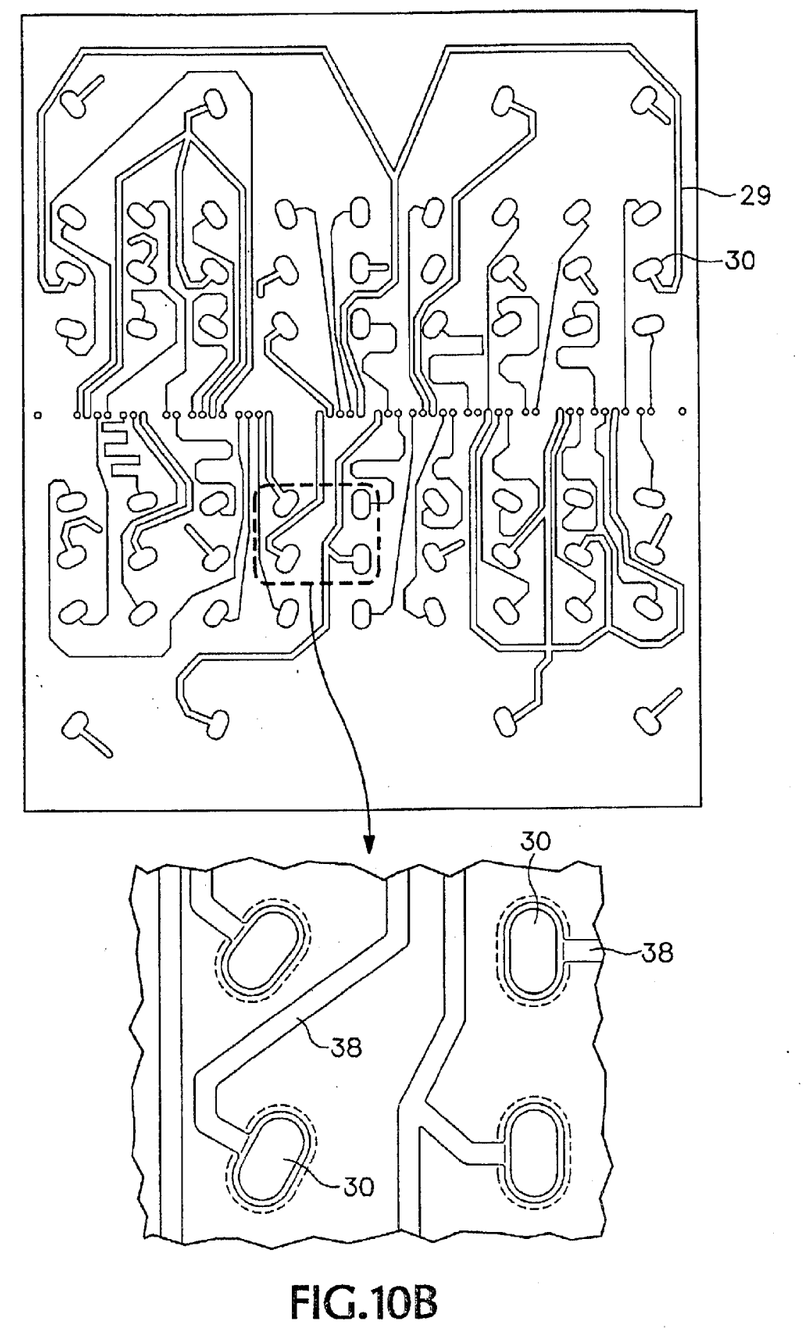
FIG. 10B is a plan view of FIG. 10A showing a first patterned conductor layer for forming the conductive bump pad and the interconnection line.

Then, as shown in FIGS. 10A and 10B, a first patterned conductor layer 102 is formed over the multi-layer structure 27 comprising the first and second polymer layers 26, 28 for forming signal lines 29 and a conductive bump pad 30.

According to one aspect of the present invention, in this step, an elongated conductive bump pad 30 is formed having a first length-wise end 32 and a second length-wise end 34. Here, the pad 30 includes an interconnection 38 extending from the side 36 thereof intermediate the first and the second ends 32, 34. See FIG. 2.

The first patterned conductor layer 102 preferably comprises Cr/Cu/Cu/Ni. Alternatively, the first patterned conductor layer can be formed of a material such as aluminum, nickel, copper, silver, copper alloys, aluminum alloys and nickel alloys. In addition, the first patterned conductor layer is preferably formed to a thickness of 1–20 µm. The first patterned conductor layer 102 can be formed in combination with etching and one of sputtering, evaporating or electroless plating.

Also, as shown FIG. 10B, the plurality of elongated conductive bump pads 30 is disposed in a substantially radial fashion to better accommodate the flexure due to CTE mismatch. Here, an underbump metallurgy (not shown) can be formed over each of the elongated bump pads 30.

Figure 11:
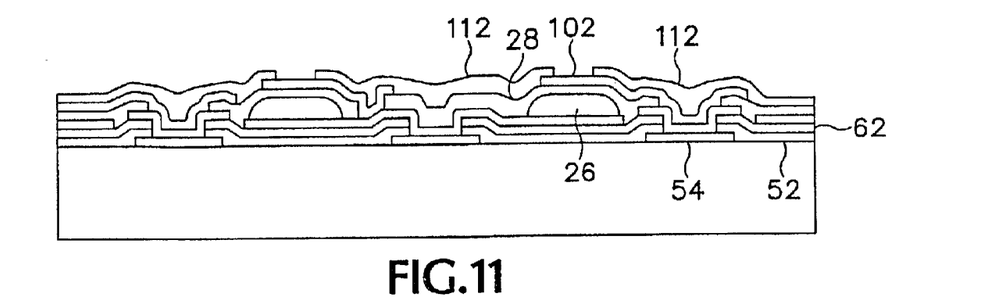
FIG. 11 is a cross-sectional view showing a patterned dielectric layer formed overlying the patterned metal layer shown in FIGS. 10A and 10B.

Turning to FIG. 11, a first patterned insulation layer 112 is formed over the first patterned conductor layer 102. Further, the first patterned insulation layer 112 has an opening 114 therein. The opening 114 exposes a portion of the first patterned conductor layer 112 where conductive bumps 21 is to be mounted.

Figure 12:
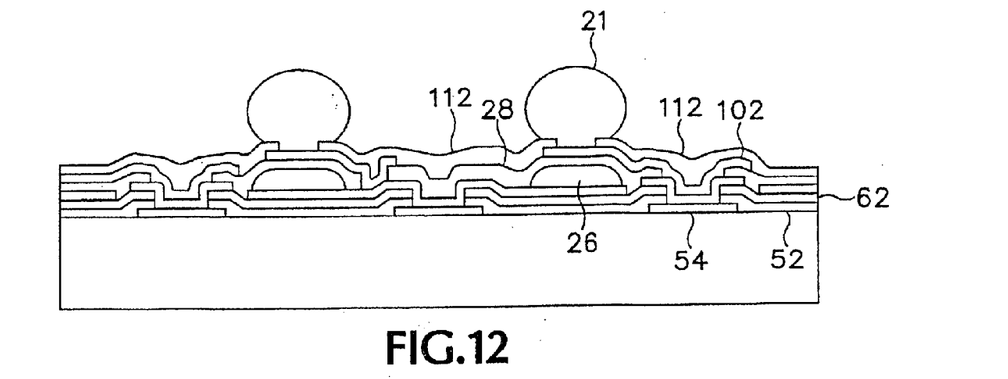
FIG. 12 is a cross-sectional view showing a conductive bump formed overlying the conductive bump pad.

Referring to FIG. 12, the conductive bumps 21 are subsequently formed over the exposed portion of first patterned conductor layer 102. The conductive bump 21 can be a conventional solder ball. Alternatively, other metal bumps such as gold wire stud bumps and electroless nickel/gold plated bumps, or conductive polymer bumps can be used.

Finally, the wafer is singulated to separate the semiconductor chips to complete a WLP in accordance with scribe lines 44 shown in FIG. 4.

In the present invention, the first polymer layers 26 of multi-layer structures 27 are physically separated from each other so that each individual multi-layer structure 27 can be deformed to accommodate the movements of the associated pad without interference from one another as shown in FIG. 8B.

Although FIGS. 4–12 have been described including the formation of the second patterned conductor layer 72 for rerouting metallization, the present invention can be implemented without the formation of the second patterned conductor layer 72, if necessary or desirable.

The WLP incorporating a thermal-stress-absorbing interface structure made in accordance with the present invention significantly enhances interconnection reliability as noted above. Also, it is believed that the interface structure of the present invention absorbs or dissipates various stresses including thermal stress applied to the various joints when the WLP is mounted on a printed circuit board and used for an extended period. This will extend the life of the WLP, and various electronic products such as cellular phones incorporating WLP.

Having described and illustrated the principles of the invention in a preferred embodiment thereof, it should be apparent that the invention can be modified in arrangement and detail without departing from such principles. I claim all modifications and variation coming within the spirit and scope of the following claims.

What is claimed is:

1. A thermal-stress-absorbing interface structure between a semiconductor integrated circuit chip and a surface-mount structure, the structure comprising:

an elongated conductive-bump pad having a first length-wise end and a second length-wise end, and a side, the pad having an interconnection line extending from the side thereof intermediate the first and the second ends, the interconnection line being electrically connected to the chip; and a first polymer layer having an exposed surface, and a second polymer layer, each having a different modulus of elasticity, disposed below the pad, the second polymer layer extending over substantially the entire exposed surface of the first polymer layer to absorb a thermal stress during thermal cycling.

2. The structure of claim 1, further comprising a conductive bump over the pad, over the pad, wherein the conductive bump is mounted on the surface-mount structure.

3. The structure of claim 2, wherein the conductive bump maintains a normal normal relationship with respect to a plane of the surface-mount structure upon thermal cycling.

4. The structure of claim 1, wherein the first polymer layer comprises an an elastomer.

5. The structure of claim 4, wherein the elastomer comprises a polysiloxane.

6. The structure of claim 1, wherein the first polymer is formed to a thickness of between approximately 5–35 µm.

7. The structure of claim 1, wherein the second polymer layer comprises a polyimide.

8. The structure of claim 7, wherein the polyimide second polymer layer is formed to a thickness of approximately 2–50 µm.

9. The structure of claim 1, wherein the first polymer layer is a substantially oval shape in plan view.

10. The structure of claim 1, wherein the conductive bump pad has an oval shape in plan view.

11. A semiconductor interface structure, comprising:

an elongated conductive-bump pad having a long axis and a short axis;

a support structure having, in cross-section, a dome-shape, the support structure underlying the pad configured to rock about the short axis during thermal cycling.

a polymer layer covering the dome-shaped support structure.

12. The semiconductor interface structure of claim 11, wherein the dome-shape support structure comprises an elastomer and the polymer layer comprises a polyimide.

13. The semiconductor interface structure of claim 11, wherein the pad is an oval shape in plan view.

14. The semiconductor interface structure of claim 11, wherein the pad has interconnection line extending from the center thereof along the short axis.

15. The semiconductor assembly, comprising:

a semiconductor integrated circuit chip having a plurality of chip pads and a passivation layer;

a plurality of elongated conductive bump pads, each of the pads having a first length-wise end and a second length-wide end, each pad having an interconnection line extending from the side thereof intermediate the first and the second ends, the interconnection line being electrically connected to the chip; and a plurality of multi-layer thermal-stress-absorbing structures each disposed below one of the pads, each of the muti-layer structures having a center axis, wherein each of the multi-layer structure comprises:

a first polymer layer, and a second polymer layer covering the first polymer layer.

16. The simiconductor assembly of claim 15, wherein the first and second polymer layers and the pad including the inteconnection line extending from the side thereof intermediate the first and the second ends along the center axis cooperatively allows the first end of the pad to move up when the second end of the pad moves down and alternately allows the first end to move down when the second end moves up upon thermal cycling, the first and second polymers resiliently deformable accommodating the up-and-down movements of the pad, upon the thermal cycling, to absorb thermal stress gerated during thermal cycling, whereby the up-and-down movements of the pad and the deformation of the first and second polymers are balanced on the center axis.

17. A semiconductor interface structure, comprising:

an elongated conductive-bump pad having a long axis and a short axis; and a support structure having, in cross-section, a dome-shape, the support structure underlying the pad configured to rock about the short axis during thermal cycling, wherein the pad has an interconnection line extending from the center thereof along the short axis.

* * * * *

UNITED STATES PATENT AND TRADEMARK OFFICE
CERTIFICATE OF CORRECTION

PATENT NO. : 6,836,018 B2
DATED : December 28, 2004
INVENTOR(S) : Kim et al.

It is certified that error appears in the above-identified patent and that said Letters Patent is hereby corrected as shown below:

Title page,
Item [56], References Cited, U.S. PATENT DOCUMENTS,
replace "2001/0004943 A1    6/2001" with
-- 2001/0004943 A1    Jan 28, 01 --.

Column 8,
Line 45, replace "over the pad, over the pad, wherein" with -- over the pad, wherein --.
Line 51, replace "an an elastomer" with -- an elastomer --.

Column 9,
Line 4, replace "cycling." with -- cycling; and --.
Line 14, replace "15. The semiconductor" with -- 15. A semiconductor --.

Column 10,
Line 1, replace "simiconductor" with -- semiconductor --.
Line 14, replace "stress gerated during" with -- stress generated during --.

Signed and Sealed this

Twenty-first Day of February, 2006

JON W. DUDAS
*Director of the United States Patent and Trademark Office*

UNITED STATES PATENT AND TRADEMARK OFFICE
CERTIFICATE OF CORRECTION

PATENT NO. : 6,836,018 B2 Page 1 of 1
DATED : December 28, 2004
INVENTOR(S) : Kim et al.

It is certified that error appears in the above-identified patent and that said Letters Patent is hereby corrected as shown below:

Column 9,
Line 20, replace "length-wide end," with -- length-wise end, --.

Signed and Sealed this

Eighteenth Day of April, 2006

JON W. DUDAS
*Director of the United States Patent and Trademark Office*